(12) United States Patent
Lin et al.

(10) Patent No.: US 9,006,092 B2
(45) Date of Patent: Apr. 14, 2015

(54) SEMICONDUCTOR STRUCTURE HAVING FLUORIDE METAL LAYER AND PROCESS THEREOF

(75) Inventors: Kun-Hsien Lin, Hsinchu (TW);
Chun-Hsien Lin, Tainan (TW); Hsin-Fu Huang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 43 days.

(21) Appl. No.: 13/288,041

(22) Filed: Nov. 3, 2011

(65) Prior Publication Data

US 2013/0113053 A1    May 9, 2013

(51) Int. Cl.
| | |
|---|---|
| H01L 21/02 | (2006.01) |
| H01L 21/3205 | (2006.01) |
| H01L 21/8238 | (2006.01) |
| H01L 21/28 | (2006.01) |
| H01L 29/49 | (2006.01) |
| H01L 29/66 | (2006.01) |
| H01L 21/265 | (2006.01) |
| H01L 29/51 | (2006.01) |

(52) U.S. Cl.
CPC ....... *H01L 21/823842* (2013.01); *H01L 21/265* (2013.01); *H01L 21/28088* (2013.01); *H01L 29/4966* (2013.01); *H01L 29/513* (2013.01); *H01L 29/517* (2013.01); *H01L 29/66545* (2013.01)

(58) Field of Classification Search
CPC ............. H01L 29/4966; H01L 21/823842; H01L 21/28088
See application file for complete search history.

(56) References Cited

U.S. PATENT DOCUMENTS

| | | | |
|---|---|---|---|
| 6,043,138 A | 3/2000 | Ibok | |
| 6,372,605 B1 | 4/2002 | Kuehne | |
| 6,509,232 B1 | 1/2003 | Kim | |
| 6,544,853 B1 | 4/2003 | Lin | |
| 6,670,275 B2 | 12/2003 | Lee | |
| 6,855,607 B2 | 2/2005 | Achuthan | |
| 7,013,446 B2 | 3/2006 | Ohba | |
| 7,030,430 B2 | 4/2006 | Doczy | |
| 7,084,025 B2 | 8/2006 | Phua | |
| 7,112,495 B2 | 9/2006 | Ko | |
| 7,153,755 B2 | 12/2006 | Liu | |
| 7,208,366 B2 | 4/2007 | Tsai | |
| 7,250,658 B2 | 7/2007 | Doris | |
| 7,384,880 B2 | 6/2008 | Brask | |
| 7,521,324 B2 | 4/2009 | Ohmi | |
| 7,531,437 B2 | 5/2009 | Brask | |
| 7,592,270 B2 | 9/2009 | Teo | |
| 7,601,648 B2 | 10/2009 | Chua | |
| 7,824,990 B2 | 11/2010 | Chang | |
| 2005/0202624 A1 | 9/2005 | Li | |
| 2006/0244079 A1* | 11/2006 | Wang et al. | 257/407 |
| 2007/0015365 A1 | 1/2007 | Chen | |
| 2007/0059874 A1* | 3/2007 | Moumen et al. | 438/199 |
| 2007/0072376 A1 | 3/2007 | Chen | |
| 2007/0218661 A1 | 9/2007 | Shroff | |
| 2007/0272975 A1* | 11/2007 | Schaeffer et al. | 257/327 |

(Continued)

*Primary Examiner* — Whitney T Moore
*Assistant Examiner* — Joseph Galvin, III
(74) *Attorney, Agent, or Firm* — Winston Hsu; Scott Margo

(57) ABSTRACT

A semiconductor structure includes a substrate, a dielectric layer and a fluoride metal layer. The dielectric layer is located on the substrate. The fluoride metal layer is located on the dielectric layer. Furthermore, the present invention also provides a semiconductor process to form said semiconductor structure.

17 Claims, 5 Drawing Sheets

(56) References Cited

U.S. PATENT DOCUMENTS

| | | |
|---|---|---|
| 2008/0061366 A1 | 3/2008 | Liu |
| 2008/0076268 A1* | 3/2008 | Kraus et al. .................. 438/785 |
| 2009/0014809 A1* | 1/2009 | Sekine et al. ................. 257/369 |
| 2009/0057759 A1 | 3/2009 | Obradovic |
| 2009/0124097 A1 | 5/2009 | Cheng |
| 2009/0200494 A1 | 8/2009 | Hatem |
| 2009/0289284 A1 | 11/2009 | Goh |
| 2010/0001348 A1* | 1/2010 | Mitsuhashi et al. .......... 257/368 |
| 2010/0044783 A1 | 2/2010 | Chuang |
| 2010/0048027 A1 | 2/2010 | Cheng |
| 2010/0075507 A1 | 3/2010 | Chang |
| 2010/0129994 A1 | 5/2010 | Awad |
| 2010/0184281 A1 | 7/2010 | Hsu |
| 2011/0081775 A1* | 4/2011 | Pierreux et al. ............... 438/591 |
| 2011/0127618 A1* | 6/2011 | Scheiper et al. ............... 257/402 |
| 2011/0189847 A1* | 8/2011 | Tsai et al. ..................... 438/595 |

* cited by examiner

SEMICONDUCTOR STRUCTURE HAVING FLUORIDE METAL LAYER AND PROCESS THEREOF

BACKGROUND OF THE INVENTION

1. Field of the Invention

The present invention relates generally to a semiconductor structure and process thereof, and more specifically, to a semiconductor structure having a fluoride metal layer, and process thereof.

2. Description of the Prior Art

Poly-silicon is conventionally used as a gate electrode in semiconductor devices like metal-oxide-semiconductors (MOS). With the trend towards scaling down the size of semiconductor devices, conventional poly-silicon gates face problems, such as inferior performance due to boron penetration and unavoidable depletion effect. This increases the equivalent thickness of the gate dielectric layer, reduces the gate capacitance, and decreases the driving force of the devices. Therefore, work function metals that are suitable to serve as high-K gate dielectric layers are used to replace the conventional poly-silicon gate to be the control electrode.

As semiconductor technologies are miniaturized to the nanometer scale, work function metal gate structures are close to their physical and electrical limitations, giving rise to problems of electrical unreliability of the gate structures, such as degraded NBTI values (negative bias temperature instability). For a complementary metal-oxide semiconductor (CMOS), dual work function metal gates need to be paired with an NMOS component and a PMOS component; integrated technologies and process controls of components are therefore more complicated, and the process efficiency restrained. Thus, the improvement of the electrical performances of the gate structures of PMOS or NMOS transistors is a big challenge to overcome, by, for example, improving the work function value of the gate structures.

SUMMARY OF THE INVENTION

The present invention provides a semiconductor structure and process thereof, which comprises a fluoride work function metal layer, where a part of the fluorine ions in the fluoride work function metal layer is to diffuse into a dielectric layer below, thereby improving the work function value of the work function metal layer, and increasing the electrical reliability of the semiconductor structure.

The present invention provides a semiconductor structure including a substrate, a dielectric layer and a fluoride metal layer. The dielectric layer is located on the substrate. The fluoride metal layer is located on the dielectric layer.

The present invention provides a semiconductor process including the following steps. A substrate is provided. A dielectric layer is formed on the substrate. A fluoride metal layer is formed on the dielectric layer.

The present invention provides a semiconductor structure with a fluoride work function metal layer, and process thereof. Since the work function metal layer contains fluorine ions, the work function metal layer can have a work function value closer to that of the bandwidth. Thus, the effective work function value of the semiconductor structure is improved. Besides, the fluorine ions of the fluoride work function metal layer can diffuse into the dielectric layer below, so that the NBTI (negative bias temperature instability) value decreases, and the electrical reliability increases.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
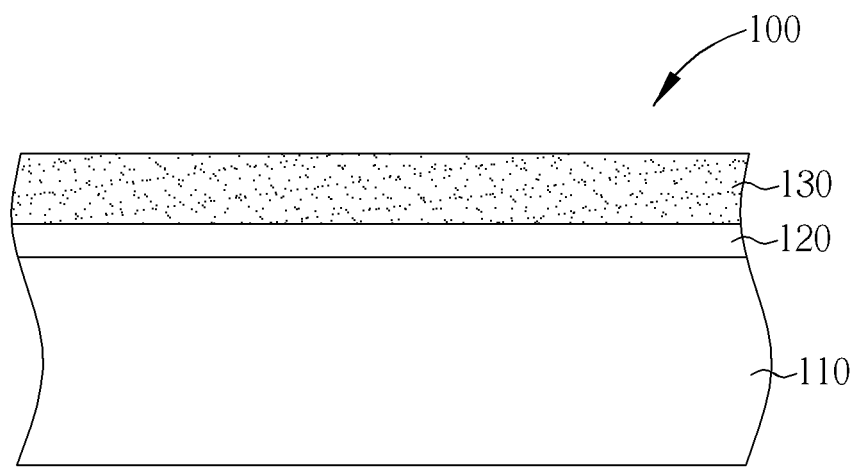
FIG. 1 schematically depicts a cross-sectional view of a semiconductor structure according to one embodiment of the present invention.

FIG. 1 schematically depicts a cross-sectional view of a semiconductor structure according to one embodiment of the present invention. As shown in FIG. 1, a semiconductor structure 100 includes a substrate 110, a dielectric layer 120 and a fluoride metal layer 130. The dielectric layer 120 is located on the substrate 110. The fluoride metal layer 130 is located on the dielectric layer 120. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The dielectric layer 120 may be a dielectric layer having a high dielectric constant, such as a metal containing dielectric layer, including hafnium oxide or zirconium oxide etc. The dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZrxTi1-xO_3$, PZT) and barium strontium titanate ($BaxSr_1-xTiO_3$, BST). If the dielectric layer 120 is a hafnium oxide layer, the hafnium oxide layer can be nitrided to become a hafnium silicon oxynitride (HfSiON) layer. This way, the dielectric constant of the dielectric layer 120 can be increased. In this embodiment, the dielectric layer 120 is a single layer. In another embodiment, the dielectric layer 120 may be a multilayer. For example, the dielectric layer 120 may include a dielectric layer having a high dielectric constant and a buffer layer located between the substrate 110 and the dielectric layer having a high dielectric constant.

In this embodiment, the dielectric layer 120 is preferably a fluoride dielectric layer having a high dielectric constant, which may be formed by directly doping fluorine ions in the dielectric layer 120, or may be formed by downwards diffusion of fluorine ions from a material layer containing fluorine ions disposed upon the dielectric layer 120. Thus, due to the dielectric layer 120 having fluoride ions, the NBTI (negative bias temperature instability) value can be reduced, and the electrical reliability increased.

The fluoride metal layer 130 includes a fluoride work function metal layer. The fluoride work function metal layer may be a fluoride titanium nitride layer in a PMOS transistor, but not limited thereto. Compared with a work function metal layer used in current processes, the work function value of the fluoride metal layer 130 in the present invention can be closer to that of the bandwidth, so that the work function value of the semiconductor structure can be improved.

A semiconductor process including two embodiments for forming said semiconductor structure 100 is described below.

Figure 2:
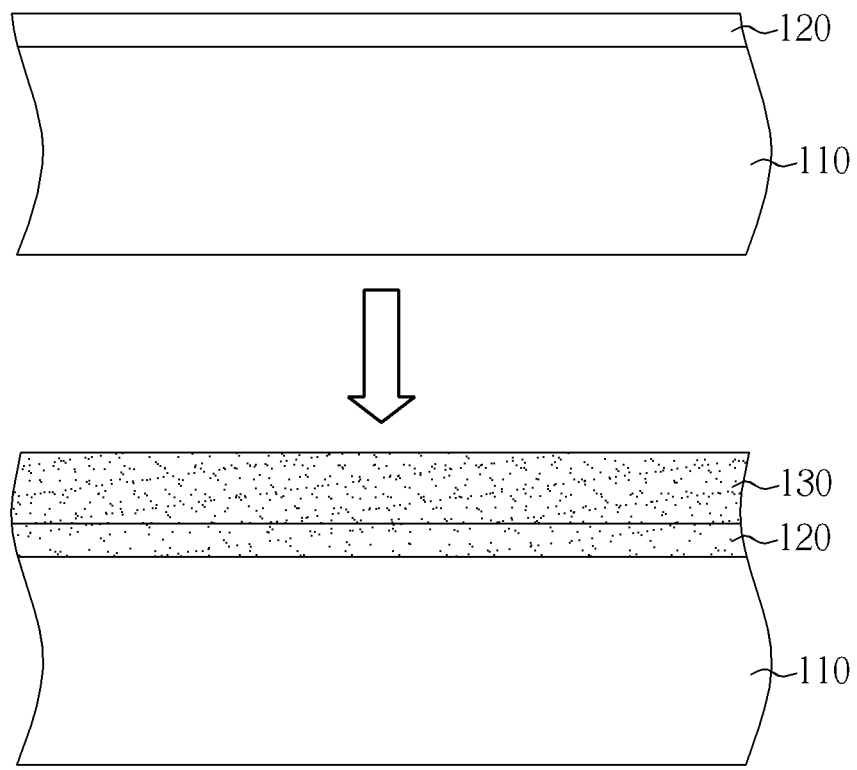
FIG. 2 schematically depicts a processing diagram of a semiconductor process according to one embodiment of the present invention.

FIG. 2 schematically depicts a processing diagram of a semiconductor process according to one embodiment of the present invention. As shown in the top diagram of FIG. 2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A dielectric layer 120 is formed on the substrate 110. The dielectric layer 120 may be a dielectric layer having a high dielectric constant, such as a metal containing dielectric layer, including hafnium oxide or zirconium oxide etc.

As shown in the bottom diagram of FIG. 2, a fluoride metal layer 130 is formed on the dielectric layer 120. The fluoride metal layer 130 may be a fluoride work function metal layer. The fluoride metal layer 130 used for a PMOS transistor application may be a fluoride titanium nitride layer, but it is not limited thereto. The fluoride metal layer 130 may be formed by an atomic layer deposition (ALD) process or a chemical vapor deposition (CVD) process etc. In this embodiment, the fluoride metal layer 130 is formed by an atomic layer deposition (ALD) process, and the precursor of the atomic layer deposition (ALD) process may be a fluoride precursor. For instance, the fluoride precursor may include, but is not limited to, titanium tetrafluoride ($TiF_4$). Therefore, a fluoride metal layer 130 can be formed. Furthermore, the fluoride metal layer 130 can diffuse fluorine ions into the dielectric layer 120, so that the dielectric layer 120 becomes a fluoride containing dielectric layer.

Figure 3:
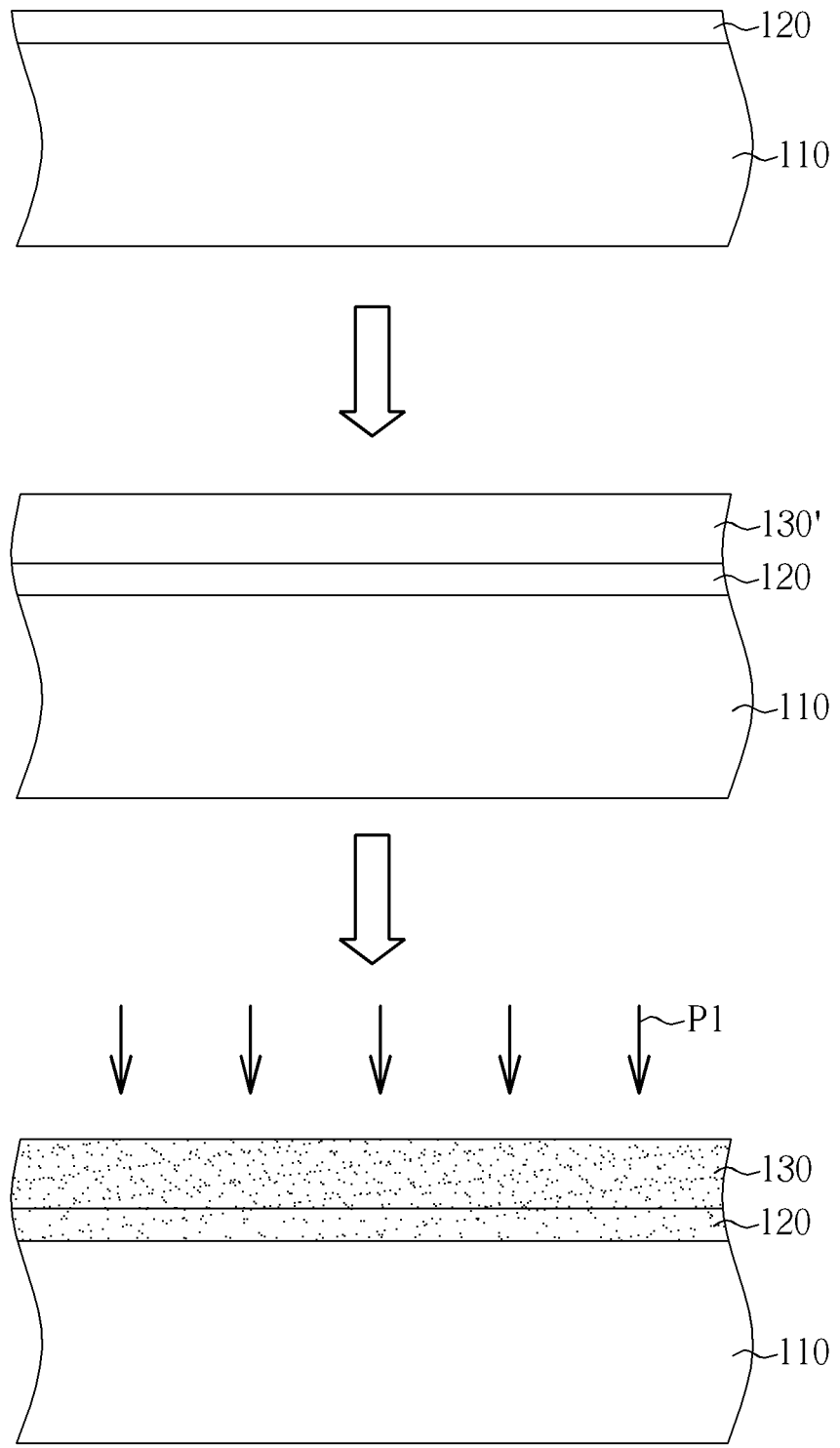
FIG. 3 schematically depicts a processing diagram of a semiconductor process according to another embodiment of the present invention.

FIG. 3 schematically depicts a processing diagram of a semiconductor process according to another embodiment of the present invention. As shown in the top diagram of FIG. 3, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A dielectric layer 120 is formed on the substrate 110. The dielectric layer 120 may be a dielectric layer having a high dielectric constant, such as a metal containing dielectric layer, including hafnium oxide or zirconium oxide etc.

As shown in the middle diagram and the bottom diagram of FIG. 3, a fluoride metal layer 130 is formed on the dielectric layer 120. The forming methods are described as follows.

As shown on the middle part of FIG. 3, a metal layer 130' is formed on the dielectric layer 120, wherein the metal layer 130' may be a work function metal layer, such as a titanium nitride layer, but not limited thereto. As shown in the bottom diagram of FIG. 3, fluorine ions are doped into the metal layer 130' by an implanting process P1, such as an ion implantation process, etc. Thus, the fluoride metal layer 130 is formed.

The semiconductor structure 100 of the present invention may also be applied to semiconductor processes such as MOS transistor processes or CMOS transistor processes etc. Embodiments of a MOS transistor process and a CMOS transistor process including the present invention are further described for clearly disclosing the present invention, but the present invention is not restricted to these. A gate-last for high-k first process is applied in the following embodiments as example, but the present invention can also be applied to other semiconductor processes such as a gate-first process or a gate-last for high-k last process etc.

Figure 4:
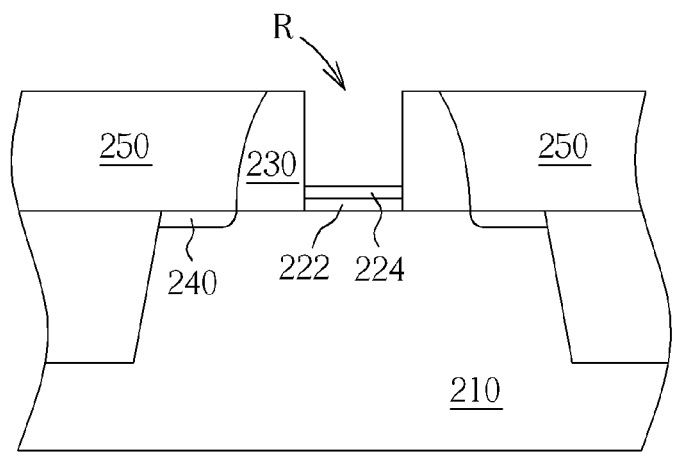
FIGS. 4-6 schematically depict a cross-sectional view of a MOS transistor process according to one embodiment of the present invention.
Figure 5:
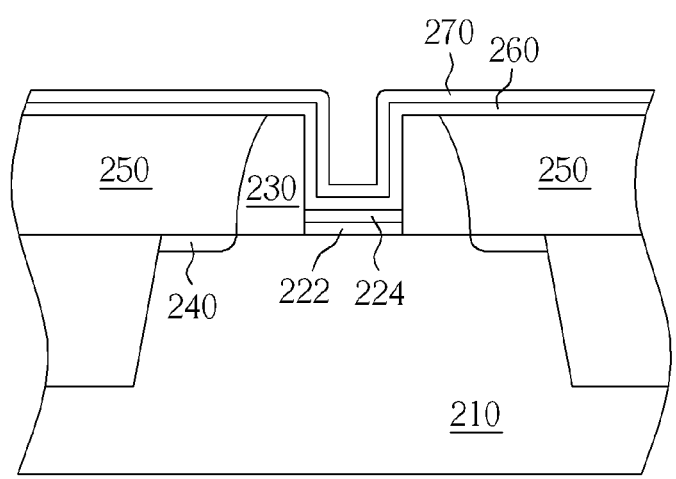
Figure 6:
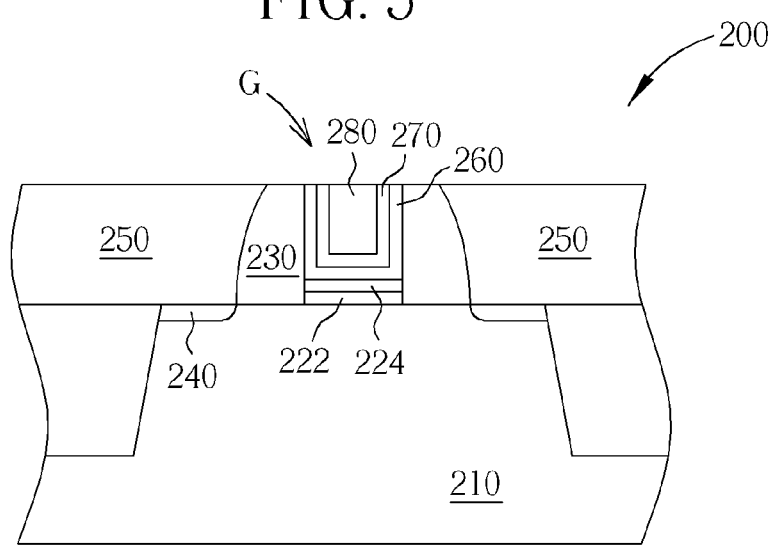

FIGS. 4-6 schematically depict a cross-sectional view of a MOS transistor process according to one embodiment of the present invention. As shown in FIG. 4, a buffer layer (not shown), a dielectric layer having a high dielectric constant (not shown), a sacrificial gate layer (not shown) and a cap layer (not shown) are sequentially formed on the substrate 210. The cap layer (not shown), the sacrificial gate layer (not shown), the dielectric layer having a high dielectric constant (not shown) and the buffer layer (not shown) are sequentially patterned to form a buffer layer 222, a dielectric layer having a high dielectric constant 224, a sacrificial gate layer (not shown) and a cap layer (not shown). Spacers 230 are formed on the sides of the buffer layer 222, the dielectric layer having a high dielectric constant 224, the sacrificial gate layer (not shown) and the cap layer (not shown). A source/drain region 240 is formed in the substrate 210 on the sides of the spacers 230 by implanting. An interdielectric layer 250 is formed on the substrate 210. The interdielectric layer 250 is planarized by methods such as a polishing process, and the cap layer (not shown) is removed to expose the sacrificial gate layer (not shown). The sacrificial gate layer (not shown) is etched and removed, and then a recess R is formed. The steps of the gate-last for high-k first process are known in the art, and therefore are not described in detail. A bottom barrier layer such as a titanium nitride layer may be selectively formed between the dielectric layer having a high dielectric constant 224 and the sacrificed gate layer (not shown) to avoid the dielectric layer having a high dielectric constant 224 from being damaged while the sacrificed gate layer (not shown) is removed.

As shown in FIG. 5, a barrier layer 260 is selectively formed on the dielectric layer having a high dielectric constant 224, wherein the barrier layer 260 may be a single layer structure or a multilayer structure composed of tantalum nitride (TaN) or titanium nitride (TiN) etc. In this embodiment, the barrier layer 260 may be a tantalum nitride layer. A fluoride metal layer 270 is formed, which covers the barrier layer 260 and the sidewalls of the recess R, to serve as a fluoride work function metal layer. The fluoride metal layer 270 may be formed by the methods of said two embodiments (FIG. 2 and FIG. 3).

As shown in FIG. 6, after the fluoride work function metal layer 270 is formed, a metal gate layer 280 is formed on the fluoride metal layer 270. The metal gate layer 280, the fluoride work function metal layer 270 and the barrier layer 260 are planarized to form a gate structure G. The gate structure G is a stacked structure constituted by the barrier layer 260, the fluoride work function metal layer 270 and the metal gate layer 280. The metal gate layer 280 may be a fluoride metal gate layer to further improve the performance. The fluoride metal gate layer may be a fluoride aluminum electrode layer formed by an atomic layer deposition (ALD) process with a precursor of aluminum fluoride ($AlF_3$), or a fluoride tungsten electrode layer formed by an atomic layer deposition (ALD) process with a precursor of tungsten hexafluoride ($WF_6$), but the present invention is not limited thereto.

Due to the semiconductor structure 200 of the present invention having a fluoride metal layer 270 used as a work function metal layer, the work function value of the semiconductor structure 200 can be closer to that of the bandwidth and the semiconductor structure 200 can therefore be improved. In a preferred embodiment, the work function value of the semiconductor structure 200, and more specifically, of the semiconductor structure 200 as a PMOS transistor, can be comprised between 4.9 eV and 5.1 eV. Some of the fluorine ions in the fluoride metal layer 270 may diffuse into the barrier layer 260 and the dielectric layer having a high dielectric constant 224; and a fluoride barrier layer and a fluoride dielectric layer having a high dielectric constant can be formed, so that the electrical performance of the semiconductor structure 200 is improved. For instance, the NBTI (negative bias temperature instability) value of the semiconductor structure 200 in the present invention can be reduced and the electrical reliability increases accordingly.

Besides getting fluorine ions by absorbing the fluorine ions from the fluoride metal layer 270, the fluoride barrier layer and the fluoride dielectric layer having a high dielectric constant can also get fluorine ions by being implanted, depending on the needs.

Figure 7:
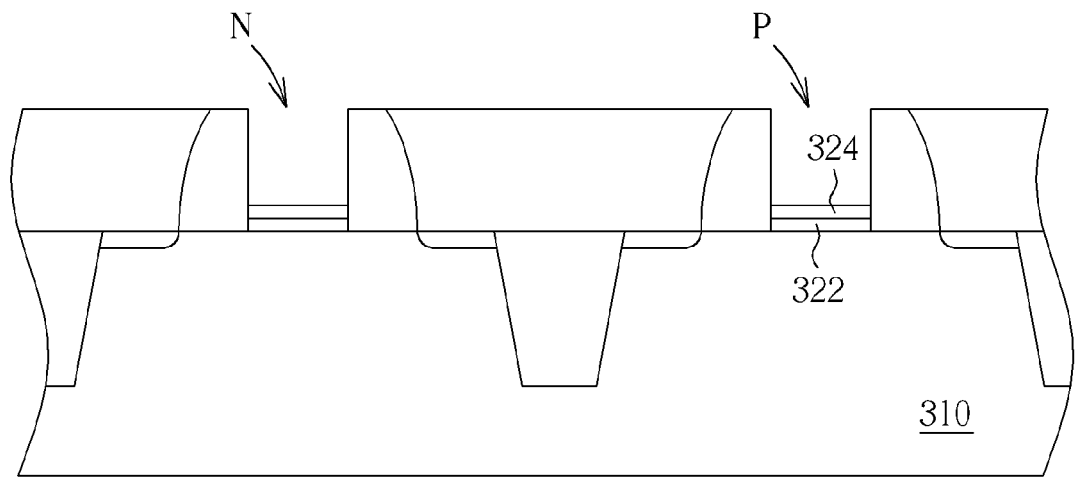
FIGS. 7-10 schematically depict a cross-sectional view of a CMOS transistor process according to one embodiment of the present invention.

FIGS. 7-10 schematically depict a cross-sectional view of a CMOS transistor process according to one embodiment of the present invention. As shown in FIG. 7, two transistor structures are simultaneously formed by said method of FIG. 4. In this embodiment, the two transistor structures are respectively used as an NMOS transistor and a PMOS transistor. The details of said method are known in the art and are not described herein. Due to a gate-last for high-k first process being applied in this embodiment, a dielectric layer having a high dielectric constant 322 is directly formed in the substrate 310. Besides, a buffer layer (not shown) may be formed between the dielectric layer having a high dielectric constant 322 and the substrate 310 for buffering. A bottom barrier layer 324 such as a titanium nitride layer may be selectively formed on the dielectric layer having a high dielectric constant 322.

Figure 8:
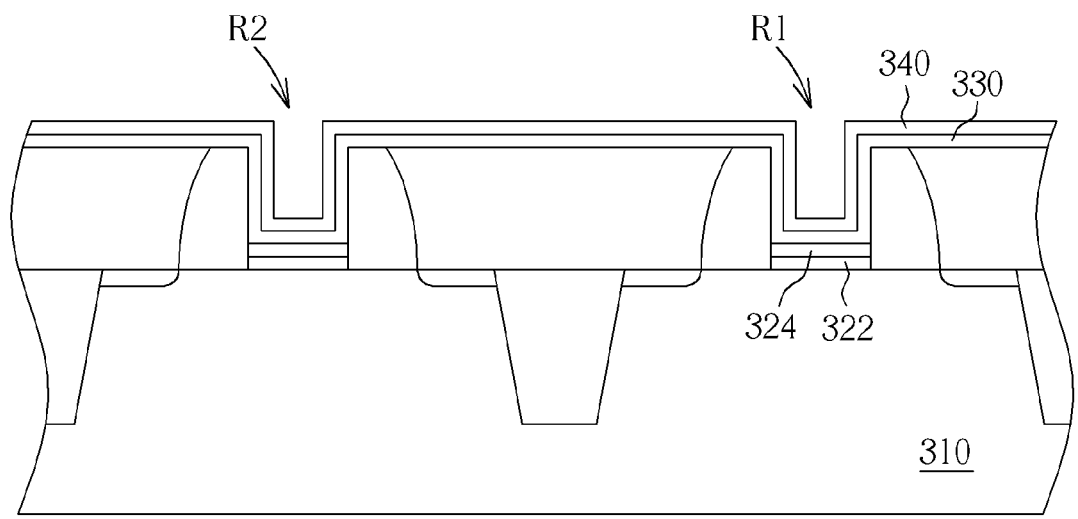

As shown in FIG. 8, a barrier layer 330 may be selectively formed on the dielectric layer having a high dielectric constant 322, wherein the barrier layer 330 may be a single layer or a multilayer structure composed of tantalum nitride (TaN) or titanium nitride (TiN) etc. In this embodiment, the barrier layer 330 is a tantalum nitride layer. A fluoride metal layer 340 is formed and covers the barrier layer 330 and the sidewalls of the recess R1 and R2 serve as a fluoride work function metal layer, wherein the fluoride metal layer 340 may be formed by the two embodiments of FIG. 2 and FIG. 3. In this embodiment, the fluoride metal layer 340 may be a titanium nitride layer, well adapted to serve as a work function metal layer in PMOS transistor.

Figure 9:
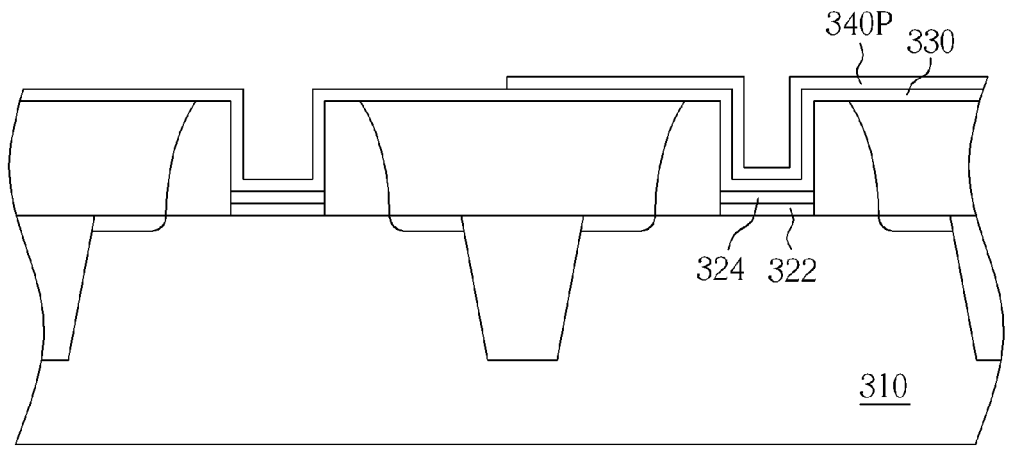

As shown in FIG. 9, the fluoride metal layer 340 may be defined and patterned by methods such as a lithography process, so that the fluoride metal layer 340 located in the NMOS transistor can be removed while the fluoride metal layer 340P located in the PMOS transistor remains intact.

Figure 10:
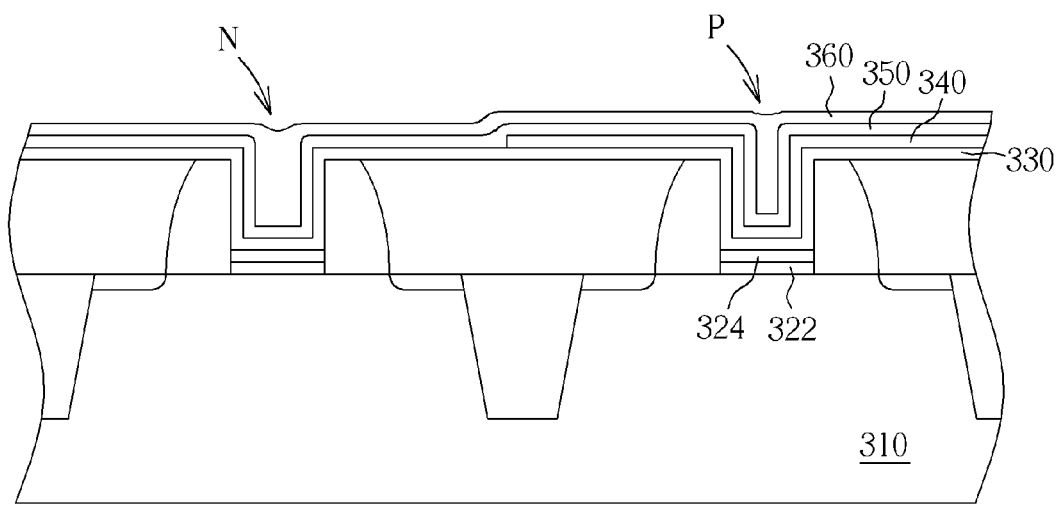

As shown in FIG. 10, a metal layer 350 entirely covers the PMOS transistor P and the NMOS transistor N. In this embodiment, the metal layer 350 is an aluminum titanium layer, well suited to be used as a work function metal layer in an NMOS transistor, but is not limited thereto. A metal gate layer 360 entirely covers the PMOS transistor P and the NMOS transistor N. The metal gate layer 360 may comprise metals such as aluminum or tungsten etc. Furthermore, the overhangs of the barrier layer and the work function metal layer in the openings of the recess R1 and R2 may be selectively removed in this embodiment.

A CMOS transistor process may be performed as following. For example, the metal gate layer 360, the metal layer 350 and the fluoride metal layer 340 may be planarized, a metal salicide may be formed, a contact etching stop layer may be formed etc, to finish the CMOS transistor.

In summary, the present invention provides a semiconductor structure and process thereof, having a fluoride work function metal layer. The fluoride work function metal layer may be formed by processes such as an atomic layer deposition process (ALD) or a chemical vapor deposition process (CVD) etc. Preferably, the fluoride work function metal layer is formed by an atomic layer deposition process (ALD), with a fluoride precursor such as titanium tetrafluoride ($TiF_4$). In addition, the fluoride work function metal layer may be formed by directly implanting fluorine ions in a work function metal layer.

Due to the work function metal layer containing fluorine ions, the work function value of the work function metal layer can be closer to that of the bandwidth, and the semiconductor structure is therefore improved. In one case, the work function value of a PMOS transistor having a fluoride work function metal layer can approach 4.9 eV~5.1 eV. Furthermore, the fluorine ions in the fluoride work function metal layer can diffuse into the dielectric layer below, leading to reducing the NBTI (negative bias temperature instability) value of the semiconductor structure, and increasing the electrical reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a substrate;
a dielectric layer located on the substrate;
a fluoride metal layer located on the dielectric layer; and
a fluoride metal gate layer located on and directly contacting the fluoride metal layer.

2. The semiconductor structure according to claim 1, wherein the dielectric layer comprises a dielectric layer having a high dielectric constant.

3. The semiconductor structure according to claim 2, wherein the dielectric layer having a high dielectric constant further comprises a hafnium oxide (HfO2) layer.

4. The semiconductor structure according to claim 1, wherein the dielectric layer having a high dielectric constant comprises a fluoride dielectric layer having a high dielectric constant.

5. The semiconductor structure according to claim 1, wherein the fluoride metal layer comprises a fluoride work function metal layer.

6. The semiconductor structure according to claim 1, wherein the fluoride metal layer comprises a fluoride titanium nitride layer.

7. The semiconductor structure according to claim 1, wherein a work function value of the semiconductor structure is between 4.9 eV and 5.1 eV.

8. The semiconductor structure according to claim 1, wherein the semiconductor structure comprises a PMOS transistor.

9. A semiconductor process, comprising:
providing a substrate;
forming a dielectric layer on the substrate;
forming a fluoride metal layer on the dielectric layer, wherein the fluoride metal layer is formed by an atomic layer deposition (ALD) process with a precursor of fluoride comprising titanium tetrafluoride (TiF4); and
forming a fluoride metal gate layer directly on the fluoride metal layer.

10. The semiconductor process according to claim 9, wherein the dielectric layer comprises a dielectric layer having a high dielectric constant.

11. The semiconductor process according to claim 9, wherein the fluoride metal layer comprises a fluoride work function metal layer.

12. The semiconductor process according to claim 9, wherein the fluoride metal layer comprises a fluoride titanium nitride layer.

13. The semiconductor process according to claim 9, wherein forming the fluoride metal layer comprises:
  forming a metal layer on the dielectric layer; and
  doping the metal layer with fluoride ions to form the fluoride metal layer.

14. The semiconductor process according to claim 9, wherein a barrier layer is formed on the dielectric layer after the dielectric layer is formed.

15. The semiconductor structure according to claim 1, further comprising a barrier layer comprising a fluoride tantalum nitride layer located between the dielectric layer and the fluoride metal layer.

16. The semiconductor structure according to claim 1, wherein the dielectric layer comprises a hafnium silicon oxynitride (HfSiON) layer.

17. The semiconductor structure according to claim 1, wherein the fluoride metal layer has a U-shaped cross-sectional profile.

* * * * *